United States Patent

Kakizaki et al.

Patent Number: 5,706,946
Date of Patent: Jan. 13, 1998

[54] THIN-PLATE SUPPORTING CONTAINER

[75] Inventors: Takeyoshi Kakizaki; Yukihiro Hyobu, both of Tokyo, Japan

[73] Assignee: Kakizaki Manufacturing Co., Ltd., Japan

[21] Appl. No.: 718,847

[22] Filed: Sep. 24, 1996

Related U.S. Application Data

[62] Division of Ser. No. 599,928, Feb. 12, 1996.

[30] Foreign Application Priority Data

| Jun. 26, 1995 | [JP] | Japan | 7-159136 |
| Jul. 7, 1995 | [JP] | Japan | 7-6915 |
| Aug. 18, 1995 | [JP] | Japan | 7-210552 |
| Aug. 18, 1995 | [JP] | Japan | 7-210553 |

[51] Int. Cl.$^6$ ............................. B65D 85/48
[52] U.S. Cl. ................... 206/454; 206/711; 211/41
[58] Field of Search ........................ 206/710, 711, 206/832, 833, 454, 449; 211/41

[56] References Cited

U.S. PATENT DOCUMENTS

| 4,762,689 | 8/1988 | Frey et al. | 206/454 |
| 5,025,926 | 6/1991 | Gregerson et al. | 206/454 |
| 5,149,244 | 9/1992 | Webber et al. | 206/454 |
| 5,154,301 | 10/1992 | Kos | 206/454 |
| 5,423,422 | 6/1995 | Boire et al. | 206/454 |

*Primary Examiner*—Paul T. Sewell
*Assistant Examiner*—Nhan T. Lam
*Attorney, Agent, or Firm*—Lorusso & Loud

[57] ABSTRACT

A thin-plate supporting container provided with supporting rib portions, each of which consists of multi-stage ribs, for supporting thin plates respectively on multiple stages at regular intervals. The ribs are provided in parallel on each of opposing side walls of the container casing in such a way that the supporting rib portions cooperate to hold the thin plates. An open end of the thin-plate supporting container serves as an inlet/outlet port, through which the thin plates are loaded and unloaded from the container. Each of the supporting rib portions is composed of an inlet portion adjacent the inlet/outlet-port and a support portion interior thereof. Further, the opening between opposed side surfaces of adjacent ribs is set to be sufficiently large that the thin plate can be easily loaded and unloaded. The rib plate support portion is formed in such a manner that the angle of inclination of its upper side surface, on which the thin plate rests, is smaller than an angle of inclination of the upper side surface of the rib inlet portion so that the thin plate can be supported accurately in a horizontal position and so that the upper surface of the rib support portion provides point-contact or line-contact with an end portion of the thin plate.

3 Claims, 15 Drawing Sheets

FIG. II

FIG. 14
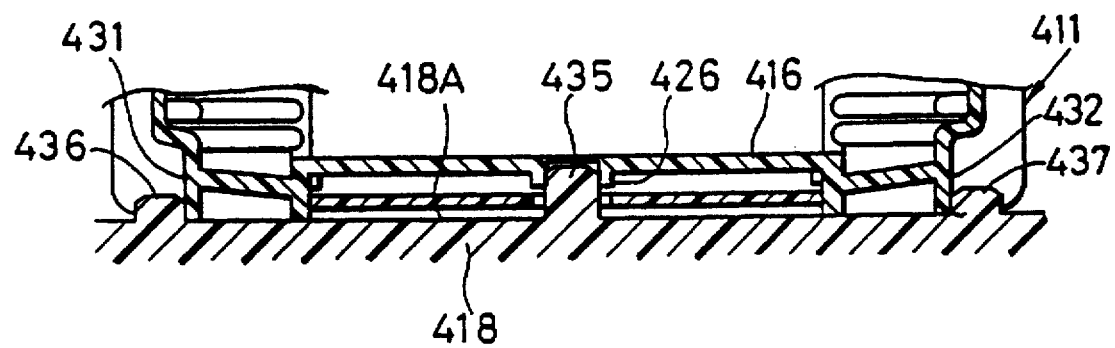
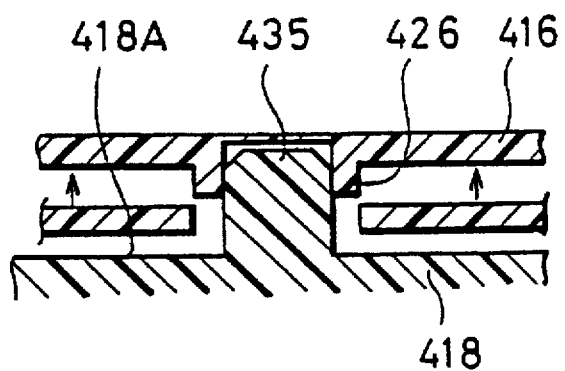
FIG. 15

1

THIN-PLATE SUPPORTING CONTAINER

This application is a division of application Ser. No. 08/599928, filed Feb. 12, 1996, pending.

BACKGROUND OF THE INVENTION

1. Field of the invention

The present invention relates to a thin-plate supporting container for containing and supporting a plurality of thin plates such as semiconductor wafers on multiple stages spaced uniformly and for storing and transferring the thin plates, each of which is automatically loaded and unloaded by a robot or the like.

2. Description of the Related Art

For example, a semiconductor wafer carrier has been conventionally used for simultaneously containing and supporting a plurality of thin plates and transporting the contained thin plates, each of which is automatically loaded and unloaded by a robot or the like. This conventional semiconductor wafer carrier will be described hereinbelow by referring to FIGS. 16 and 17. FIG. 16 is a partially cutaway perspective diagram illustrating the inner structure of one of a pair of opposed side walls of a semiconductor wafer carrier 1. FIG. 17 is a front sectional view of the semiconductor wafer carrier 1.

Roughly speaking, the semiconductor wafer carrier 1 consists of a casing 2, whose top is open so as to form a wafer inlet/outlet opening 2A, through which a wafer is loaded thereinto and is unloaded therefrom, and supporting rib portions 5 which are respectively formed on the two opposed inner side surfaces of the casing 2 and which serve to hold and support a multitude of wafers on multiple stages.

Each of the supporting rib portions 5 is composed of a multitude of ribs 5A formed in parallel on each of the side walls 3 and 4 at regular intervals. Further, each of the supporting ribs 5A is molded or formed in such a manner that the opening angle between the opposed side surfaces of adjacent ribs 5A, as well as the distance or interval between adjacent rib pieces 5A, is large and that the transverse sections of the rib pieces 5A arranged along the (lateral) length of casing 2 have the same shape.

Moreover, innermost supporting portions 5B, molded inwardly bent in the casing 2, serve to limit how deep a wafer 7 can be inserted into the casing 2, and to hold the wafer 7 in a particular position in the casing 2.

Furthermore, on a side end wall (namely, the left end wall of FIG. 16) of a left-side part 2B of the casing 2, there is provided a horizontal wafer supporting plate portion 6 for supporting the casing 2 in such a manner that the wafer 7 inserted thereinto is in an accurately horizontal position when this casing 2 is placed on a mounting base with its longitudinal side extending vertically. As viewed in this figure, another horizontal wafer supporting plate portion, which is paired with the horizontal wafer supporting plate portion 6 of the left-side part 2B, is provided on the left end wall of a right-side part (not shown) of the casing 2 and extends along the vertical length (namely, the height) of the casing 2. Additionally, a connecting plate portion 11 for connecting the pair of the horizontal wafer supporting plates with each other is provided therebetween. On this connecting plate portion 11, a positioning ridge 8 is provided between the left-side and right-side parts of the casing 2 in such a way as to connect the pair of the horizontal wafer supporting plates with each other.

All of the casing 2, the side walls 3 and 4 and the supporting rib portions 5 are made of synthetic resin and are formed in such a manner as to be solid, namely, without any hollows or holes.

In the conventional semiconductor wafer carrier 1 having the aforementioned configuration, a plurality of wafers 7 are supported in parallel with each other and on multiple stages. The plurality of wafers 7 are carried and washed together with the wafer carrier 1.

Further, when a wafer 7 is loaded into and is unloaded from this semiconductor wafer carrier 1, this carrier 1 is mounted oh the mounting base with each of the horizontal supporting portions 6 in abutting engagement with the mounting base 9.

To allow for a wafer 7 to be loaded into and unloaded from the carrier 1 by a fork or the like of a robot, the wafer carrier 1 should be accurately positioned on the mounting base.

Thus, as illustrated in FIGS. 18 and 19, the horizonal positioning of the wafer carrier 1 is effected using the positioning ridge 8 when the horizontal wafer supporting portions 6 are rested on the upper surface of the mounting base 9. Namely, a positioning fitting 10, consisting of two ridges 10A and which engages the positioning ridge 8 from both sides thereof, is formed on the mounting base 9. The positioning of the wafer carrier 1 is performed by fitting the positioning ridge 8 into a space between the two ridges 10A of the positioning fitting 10.

Thereby, the positioning of the wafers 7, which are respectively contained in the multiple slots of the stages, in the horizontal and vertical directions with respect to the fork of the robot, can be accurately achieved. Further, the wafer 7 is automatically loaded thereinto and unloaded therefrom by a fork of a robot. The fork of the robot is accurately inserted into a gap between adjacent wafers 7 vertically stacked in the wafer carrier 1 and then lifts the upper one of the wafers 7 slightly, and subsequently unloads the lifted wafer from the wafer carrier 1. Thereafter, the wafer supported by the fork is accurately inserted into the innermost position between adjacent rib pieces 5A. Then, the fork is lowered slightly so that this wafer 7 comes to be supported by the ribs 5A.

The semiconductor wafer carrier 1 is formed in such a way that the opening angle between the opposed side surfaces of adjacent ribs 5A is sufficiently large to facilitate loading and unloading the wafer 7.

On the other hand, if a shock or vibration is given to the wafer carrier 1 from the outside while carrying the wafers, a wafer 7 sometimes becomes dislodged in the wafer carrier 1. Further, when the wafer 7 is laterally dislocated in the wafer carrier 1, the wafer 7 may become inclined greatly from horizontal, because the angle of inclination of the upper side surface of each of the ribs 5A is large. As a result, when the robot automatically loads and unloads a wafer, the fork of the robot will come into contact with such an inclined wafer 7 and further the wafer 7 may also be brought into contact with a rib 5A. Thus, the aforementioned wafer carrier has drawbacks in that there are possibilities of damage to the wafer 7 and of generation of dust.

Further, if a shock or vibration given to the wafer carrier 1 is large, the wafer 7 may become largely displaced and, at worst, the wafer 7 may slide down within the wafer carrier 1.

Moreover, in the case of the aforesaid semiconductor wafer carrier 1, a thick wall of the wafer carrier 1 may be different in the coefficient of heat contraction or shrinkage from a thinner portion thereof and a heat sink may be formed because the entire casing 2, the side walls 3 and 4 and the supporting rib portions 5 are made of solid synthetic resin as described above. Furthermore, when this heat sink is formed or shrinkage is caused, an error or change in accuracy of dimension occurs, with the result that the wafer 7 cannot be maintained in a horizontal position and is sometimes held in an inclined state or position. In this case, similarly as in the aforementioned case, when a wafer is automatically loaded or unloaded by the robot, there are possibilities of damage to the wafer 7 and of generation of dust.

Furthermore, when positioning the wafer carrier 1 by means of the positioning ridge 8 and the positioning fitting 10, no problem arises in the case of a wafer 7 with a small diameter. In such a case, the positioning of this wafer carrier 1 can be achieved accurately to some extent by means of the positioning ridge 8 and the positioning fitting 10. Thus, the positioning of each of the wafers 7 with respect to the fork of the robot can also be accurately achieved.

However,, in the case of a large diameter wafer 7 and thus a wafer carrier 1 of large size, the positioning of the wafer carrier 1 cannot be achieved accurately by means of the positioning means having a simple configuration, which consists of the positioning ridge 8 and the positioning fitting 10. Consequently, the problems of damage to the wafer and of the generation of dust may arise.

The present invention seeks to solve the aforementioned problems.

It is, accordingly, an object of the present invention to provide a thin-plate supporting container which can position a thin plate accurately and can support the thin plate in a horizontal position accurately, and further can surely prevent the thin plate from being displaced by an external shock or vibration.

SUMMARY OF THE INVENTION

To solve the aforementioned problem, namely, to achieve the foregoing object, in accordance with a first aspect of the present invention, there is provided a thin-plate supporting container, which comprises supporting rib portions, each of which consists of multi-stage ribs, for supporting thin plates respectively on multiple stages at regular intervals. The supporting ribs are provided on each of the side walls of the container in parallel and in alignment with the supporting ribs on the other of the side walls for supporting the thin plate. The thin-plate supporting container is provided with an inlet/outlet opening, through which the thin plate is loaded or unloaded from the container. In this first thin-plate supporting container, each of the supporting ribs is composed of an inlet portion at the inlet/outlet-port-side thereof and, further into the container, a support portion. Further, the opening angle between opposed side surfaces of adjacent ribs at the inlet is sufficiently large that the thin plate can be easily loaded and unloaded. Further, each rib has at its support portion, an angle of inclination for its upper surface, on which the thin plate rests, which is smaller than the angle of inclination of the upper surface of its inlet portion, so that the thin plate can be supported accurately in a horizontal position and so that the upper side surface of the rib at its support portion will have point-contact or line-contact with an edge portion of the thin plate.

Further, in accordance with a second aspect of the present invention, there is provided a second thin-plate supporting container, which comprises supporting rib portions, each of which consists of multi-stage ribs, for supporting thin plates respectively on multiple stages at regular intervals. Similarly, the supporting ribs are provided on each of side walls of the container in parallel in such a way that each of the supporting ribs provided on one of the side walls and corresponding supporting ribs provided on the other of the side walls are aligned for support of a thin plate. In this second thin-plate supporting container, at least the supporting ribs are hollow.

Moreover, in accordance with a third aspect of the present invention, there is provided a third thin-plate supporting container which comprises supporting rib portions, each of which consists of multi-stage ribs, for supporting thin plates respectively on multiple stages at regular intervals. Similarly, the supporting ribs are provided on one side walls of the container in parallel and aligned with corresponding, supporting ribs provided on the other of the opposing side walls, for cooperation in supporting a thin plate. An open end of the thin-plate supporting container serves as an inlet/outlet port, through which the thin plate is loaded or unloaded from the container. In this third thin-plate supporting container, each of the ribs has a thin-plate supporting portion, for supporting an inserted thin plate in a horizontal position, and a shift preventing surface portion for abutting engagement with an inlet/outlet-port-side edge portion of the thin plate to prevent the thin plate from shifting toward the inlet/outlet port.

Furthermore, in accordance with a fourth aspect of the present invention, there is provided a fourth thin-plate supporting container which comprises supporting ribs, i.e. multi-stage ribs, for supporting thin plates respectively on multiple stages at regular intervals. Similarly, the supporting ribs are provided on each of opposing side walls of the container in parallel and aligned for cooperation in holding the thin plates. An open end of the thin-plate supporting container serves as an inlet/outlet port, through which the thin plate is loaded or unloaded from the container. In the fourth thin-plate supporting container, each of the ribs is thin throughout its length so that the distance between the adjacent rib pieces is increased, thereby facilitating the loading and unloading of the thin plate. Further, each of the rib pieces has a thin-plate supporting portion for supporting an inserted thin plate in a horizontal position and a shift preventing surface portion for abutting engagement with an inlet/outlet- port-side edge portion of the thin plate to prevent the thin plate from shifting to the inlet/outlet port.

Additionally, in accordance with a fifth aspect of the present invention, there is provided a fifth thin-plate supporting container which comprises a pair of side walls for supporting peripheral or circumferential edge portions of thin plates on multiple stages and front and rear end walls for covering front and rear end surfaces of the thin plates. Further, the thin plate is loaded or unloaded through an inlet/outlet port with one of the front and rear end walls resting on an upper surface of a mounting base. This thin-plate supporting container further comprises a positioning fitting provided at a position which corresponds to the centers of the thin plates contained in the container, on one or both of the front and rear end walls of the container, and which mates with a mounting base. This fifth embodiment further comprises a rotation prevention fitting, which is provided on a peripheral portion of the container casing and which mates with a mounting base rotation preventing fitting, for preventing the casing from rotating around the positioning fitting.

Further, a sixth embodiment is a modification of the fifth thin-plate supporting container, wherein the positioning fitting is a socket which mates with a fitting projection on the mounting base, or is a fitting projection which mounts with a socket provided as the mounting base fitting.

A seventh embodiment is yet another modification of the fifth thin-plate supporting container, wherein the rotation prevention fitting is a socket which mates with the mounting base fitting portion, a fitting projection which fits into the mounting base fitting, an elongated groove, or a slot or a ridge mating with the mounting base fitting. In an eighth thin-plate supporting container the rotation prevention fitting is provided at a location spaced as far as possible from the positioning fitting.

The first thin-plate supporting container is formed or molded in such a way that the distance between adjacent ribs is maximum at the inlet portions, whereby a thin plate can be easily loaded into and unloaded from the container. A thin plate is loaded through a space between the inlet portions of adjacent ribs and is rested on the rib portions located further into the casing. The upper surface of the rib support portion, on which the thin plate is rested, is formed with an angle of inclination smaller than the angle of inclination of the upper surface of the rib inlet portion. Practically, the angle of inclination of the upper surface of the rib support portion is 0.5 to 2.0 degrees or so, in accordance with the size of the thin plate. Accordingly, when a thin plate is put on the upper surface of the rib support portions, the ribs come into point-contact or line-contact with opposing side portions of the thin plate, because the upper surface of the ribs are inclined at a small angle to horizontal, thus giving a small contact area therebetween. Moreover, the thin plate can be maintained nearly horizontal even when the thin plate is laterally shifted a small distance.

In the case of the second embodiment, the supporting ribs and so on have a hollow structure. Thus, even in the case of an non-planar portion of the supporting rib, the thickness thereof can be made almost uniform. Therefore, the coefficient of heat contraction or shrinkage of the ribs and so on at the time of forming is nearly constant. Consequently, the dimensional accuracy of the ribs can be improved considerably.

In the case of the third embodiment, the thin plate rests on supporting portions of the ribs, supported in a horizontal position. At that time, in the case of a shock or vibration, because the peripheral edge portions of the thin plate are confined by shift preventing portions of the ribs, the thin plate is prevented from being shifted toward the inlet/outlet port.

The fourth embodiment is similar to the third embodiment, but each of the ribs is thinner throughout its length to increase the distance between adjacent ribs and to thereby facilitate the loading and unloading of the thin plate.

In the case of the fifth embodiment, the horizontal positioning of the thin plate supporting container is by engaging the positioning fitting with the mounting base fitting. Rotation of the container around the positioning fitting is prevented by mating the carrier rotation prevention fitting with the mounting base rotation preventing fitting. Consequently, the angular positioning of the thin plate supporting container is achieved.

Preferably, the positioning fitting is either a socket or a projection, with the mounting base fitting being the other. Consequently, the positioning of the thin-plate supporting container can be reliably achieved.

In various embodiments of the thin-plate supporting container, the rotation prevention fittings are sockets, projections, elongated grooves, or ridges. Such rotation prevention fittings can be easily mated with the mounting base rotation preventing fitting for angular positioning of the thin-plate supporting container.

Preferably, the rotation prevention fitting is located as far as possible from the positioning fitting to enhance the accuracy of the angular positioning of the thin-plate supporting container.

BRIEF DESCRIPTION OF THE DRAWINGS

Other features, objects and advantages of the present invention will become apparent from the following description of preferred embodiments with reference to the drawings in which like reference characters designate like or corresponding parts throughout several views, and in which:

FIG. 14 is a side sectional view of the fourth wafer carrier embodying the present invention showing the wafer-carrier positioning socket fit onto a positioning pin of the mounting base;

FIG. 15 is an enlarged portion of the sectional view of FIG. 14;

DETAILED DESCRIPTION OF THE PREFERRED EMBODIMENTS

The thin-plate supporting containers embodying the present invention are intended to hold a plurality of parallel thin plates such as semiconductor wafers, storage disks and liquid crystal plates. In the description which follows reference will be to semiconductor wafers as an example of such thin plates.

First Embodiment

Figure 3:
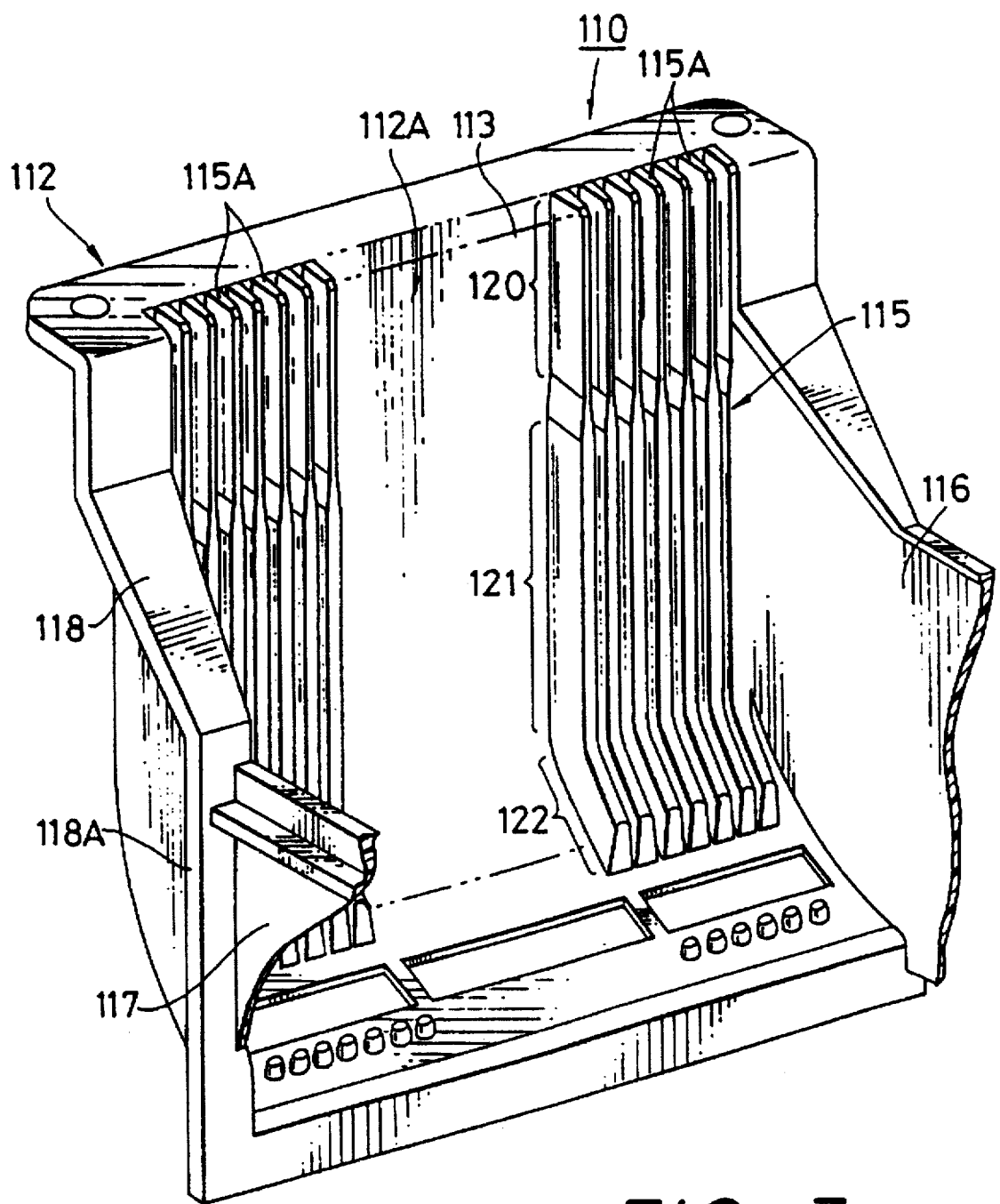
FIG. 3 is a partially cutaway perspective view of the first embodiment of the present invention.

The overall configuration of the semiconductor wafer carrier 110 of this embodiment is somewhat similar to that of the aforementioned conventional semiconductor wafer carrier 1. As illustrated in FIG. 3, the semiconductor wafer carrier 110 consists of a casing 112, whose top is open so as to form a wafer inlet/outlet port 112A, through which a wafer 211 (see FIG. 5) is loaded thereinto and is unloaded therefrom, and supporting rib portions 115 which are respectively formed on the two opposed side walls 113 (only one of the side walls 113 is shown in FIG. 3 for sake of simplicity) of the casing 112 and which are operative to hold and support a plurality of wafers 211 in parallel on multiple stages.

The two opposed side walls 113 of the casing 112 are connected with each other by an upper end wall 116 and a lower end wall 117. This casing 112 is utilized with the lower end wall 117 serving as its bottom. A horizontal wafer supporting plate portion 118 including a reference rib 118A, is used for supporting the casing 112 in such a manner that the wafers 211 supported therein are in a horizontal position when the casing 112 rests on end wall 117. The wafer inlet/outlet port 112A is an opening, through which a wafer 211 is loaded and unloaded, and has a size a little larger than the maximum diameter of a disk-like wafer 211. The same is true of the distance between the two side walls 113.

The supporting rib portion 115 is composed of a multitude of ribs 115A formed in parallel on the inner surface of each of the side walls 113 at regular 5 intervals. Further, each of the supporting ribs 115A consists of an inlet portion 120 at the inlet/outlet-port-side, a support portion 121 and an innermost portion 122 which limits how deep a wafer 211 can be inserted into the casing 112.

Figure 2:
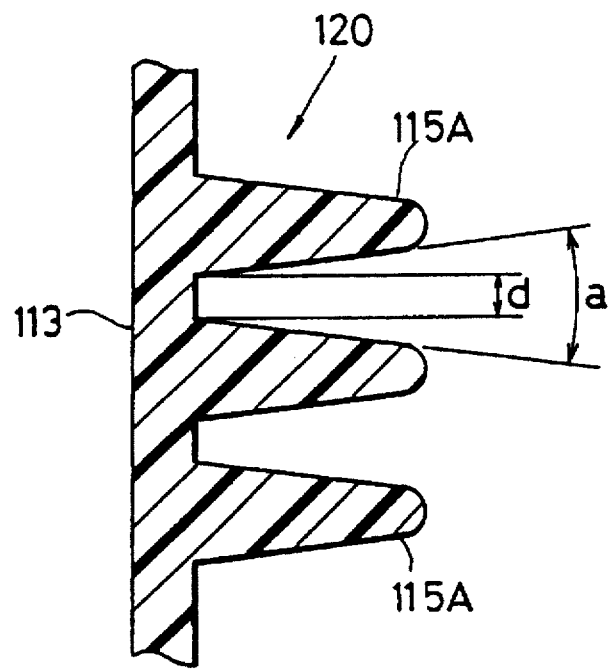
FIG. 2 is a sectional view of supporting ribs in the inlet portion of the first embodiment of the present invention.

As illustrated in FIG. 2, the rib pieces 115A are formed so that the opening angle a between opposed side surfaces of adjacent rib pieces 115A in the inlet portion 120 is large to facilitate the loading and unloading of the wafer 211.

Practically, the opening angles are set at the following numerical values for holding a 6-inch diameter wafer and an 8-inch diameter wafer 211, respectively. The angle between the side surfaces of adjacent ribs 115A, oriented with wafer 211 supported in a horizontal position, and the horizontal is set at 7 degrees. Similarly, the angle between the other side surface of the rib 115A (namely, the upper side surface as illustrated in FIG. 2) and the horizontal is set at 7 degrees. Thereby, the opening angle between the opposed side surfaces of adjacent ribs 115A is set at 14 degrees.

Figure 1:
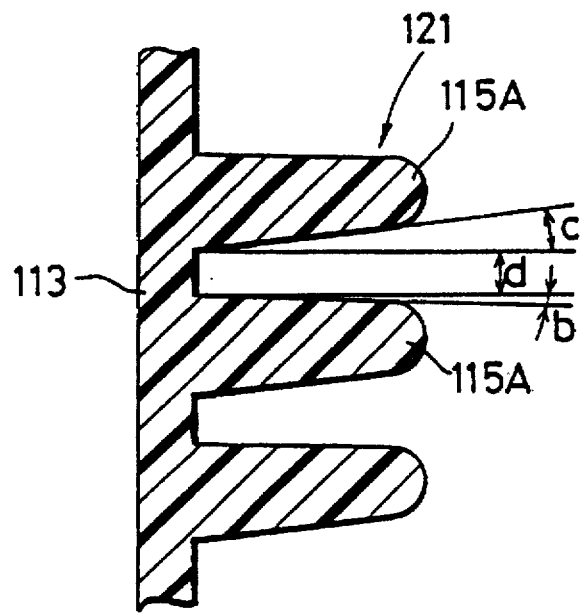
FIG. 1 is a sectional view of supporting ribs in the support portion of a first embodiment of the present invention.

As shown in FIG. 1, the upper surface, on which the wafer 211 rests within the support portion 121 of each of the ribs 115A is formed in such a manner that the angle of inclination thereof is smaller than the angle of inclination of the upper surface of the rib at the inlet portion 120. Practically, the angle of inclination of the upper surface in the support portion 121 of each of the ribs 115A is set at an angle nearly equal to zero, namely, the upper surface of the support portion 121 of each of the rib pieces 115A is close to the horizontal. This is so that the wafer 211 can be accurately supported in a horizontal position when resting on the ribs 115A, even when the wafer is laterally shifted a small distance. So that opposing edge portions of the wafer 211 come into point-contact or line-contact with the upper surfaces of ribs 115A, the upper side surface of each of the ribs 115A is inclined a little to the horizontal.

Practically, in the support portion 121, the angle of inclination of the upper surface of the rib is set for wafers 211 with diameters of 6 inches and 8 inches. The angle b between the upper surface of the ribs 115A and the horizontal is 1 degree. This angle is suitably set at a value in the range of 0.5 to 2.0 degrees or so in accordance with the size of the wafer 211. Further, the angle c between the lower surface of the ribs 115A and the horizontal is set at 7 degrees, to facilitate the loading and unloading of the wafer 211 to and from this portion.

Incidentally, the width d (see FIG. 2) of a base portion between each pair of the adjacent ribs 115A of the inlet portion 120 is equal to that of the base portion between each of a pair of the adjacent ribs 115A of the support portion 121. Thus, these portions are different from each other only in the angle of the side surface inclination.

Operation of First Embodiment

When the wafer 211 is inserted into the semiconductor wafer carrier 110 configured as above described, this wafer 211 is supported in a horizontal position by the fork (not shown) of a robot. Then, this wafer 211 is moved to an insertion position. Subsequently, the wafer 211 is inserted therefrom into the wafer carrier 110. At that time, the height of the insertion position is regulated so that in insertion of the wafer 211 into the carrier 110, this wafer 211 does not come into contact with the rib 115A while being inserted.

From this insertion position, the wafer 211 is inserted into the wafer carrier 110 until the wafer 211 abuts against the innermost supporting portion 122. The wafer 211 can be easily inserted through the inlet portion 120 owing to the large opening angle a defined by the ribs 115A of this inlet portion 120. Thereafter, the wafer 211 is carefully inserted through the support portion 121 until the wafer 211 comes into abutting engagement with the innermost supporting portion 122. Subsequently, the fork of the robot lowers slightly and thus the wafer 211 is placed on the support portions 121 of ribs 115A. In this state, the wafer 211 is supported at four points on the innermost supporting portion 122 and the support portion 121 and is thus maintained in a horizontal position. Because the upper side surface of the rib piece 115A in the support portion 121 is nearly horizontal (the angle b is 1 degree), even when the wafer 211 placed on the upper side surface of this rib piece 115A is shifted laterally, wafer 211 is maintained in a nearly horizontal position. Thereby, the distance separating adjacent wafers 211 stacked in the wafer carrier 110 is uniform.

When unloading one of the wafers 211 from the wafer carrier 110, the fork of the robot is inserted into the gap between the adjoining wafers 211. Because each of the wafers 211 is in a horizontal position and because the dimension of the gap between adjacent wafers 211 is almost uniform, the fork does not touch the wafer 211. After the fork is inserted into the carrier 110, the fork moves slightly upward and lifts the wafer 211. Then, the fork is pulled out of the wafer carrier 110 and thus the wafer 211 is unloaded therefrom. At that time, the amount of upward shift of the wafer 211 caused by the fork is set at a value which is sufficiently small that the surface of the wafer 211 does not touch the lower side surfaces of the ribs 115A in the support portion 121.

Effects of First Embodiment

As described above, in the semiconductor wafer carrier 110 of this embodiment, the wafer 211 can be supported on the upper side surface of the ribs 115A of the support portion 121 accurately in a horizontal position. Thus, when the wafer 211 is loaded and unloaded, contact between the wafer and the various portions of the carrier 110 can be reliably prevented. Thus, the generation of dust is also prevented.

Further, when inserting the fork into the casing 112, the fork is prevented from touching the wafer 211. Consequently, damage to a wafer, as well as halting of production, can be reliably prevented.

Moreover, because the upper side surfaces of the ribs 115A of the support portion 121 are slightly inclined to the horizontal, the wafer 211 has only point-contact or line-contact with the upper side surface of the ribs 115A and, in this manner, the contact area therebetween is minimized.

Second Embodiment

Figure 5:
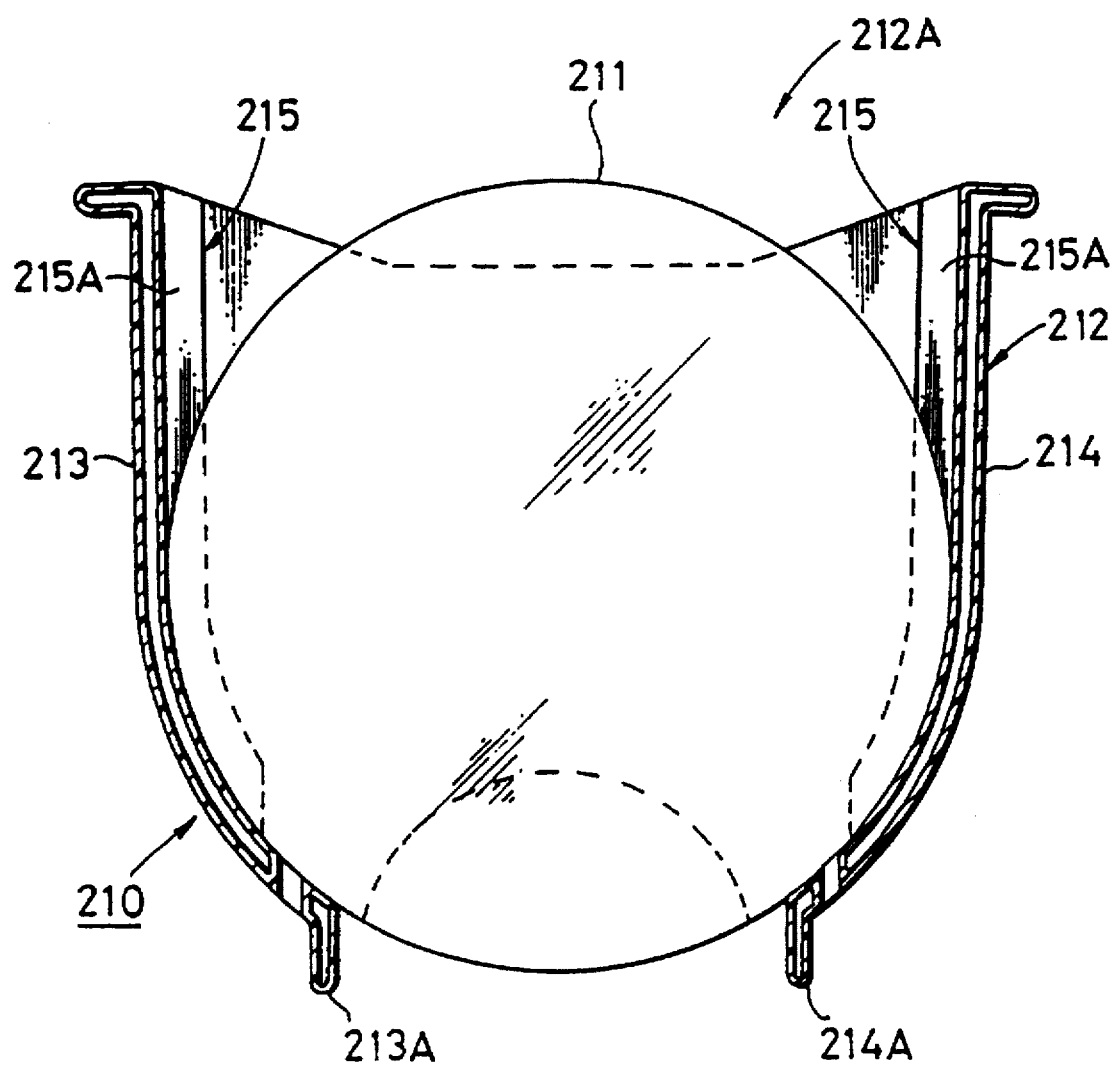
FIG. 5 is a plan sectional view of a second wafer carrier embodying the present invention, namely, the second embodiment of the present invention.

The overall configuration of semiconductor wafer carrier 210 of this embodiment is mostly similar to that of the forementioned semiconductor wafer carrier 110 of the first embodiment. Practically, as illustrated in FIG. 5, the semiconductor wafer carrier 210 consists of a casing 212, whose top is open so as to form a wafer inlet/outlet port 212A, through which a wafer 211 is loaded thereinto and is unloaded therefrom, and supporting rib portions 215 which are respectively formed on the two opposed side walls 213 and 214 of the casing 212 and which serve to hold and support a multitude of wafers 211 in parallel on multiple stages.

The casing 212 consists of the two opposed side walls 213 and 214 and end walls (not shown) for connecting the side walls 213 and 214 with each other at the upper and lower ends (namely, at the front and rear end portions illustrated in this figure). The distance between the side walls 213 and 214 is slightly larger than the maximum diameter of the disk-like wafer 211.

Figure 4:
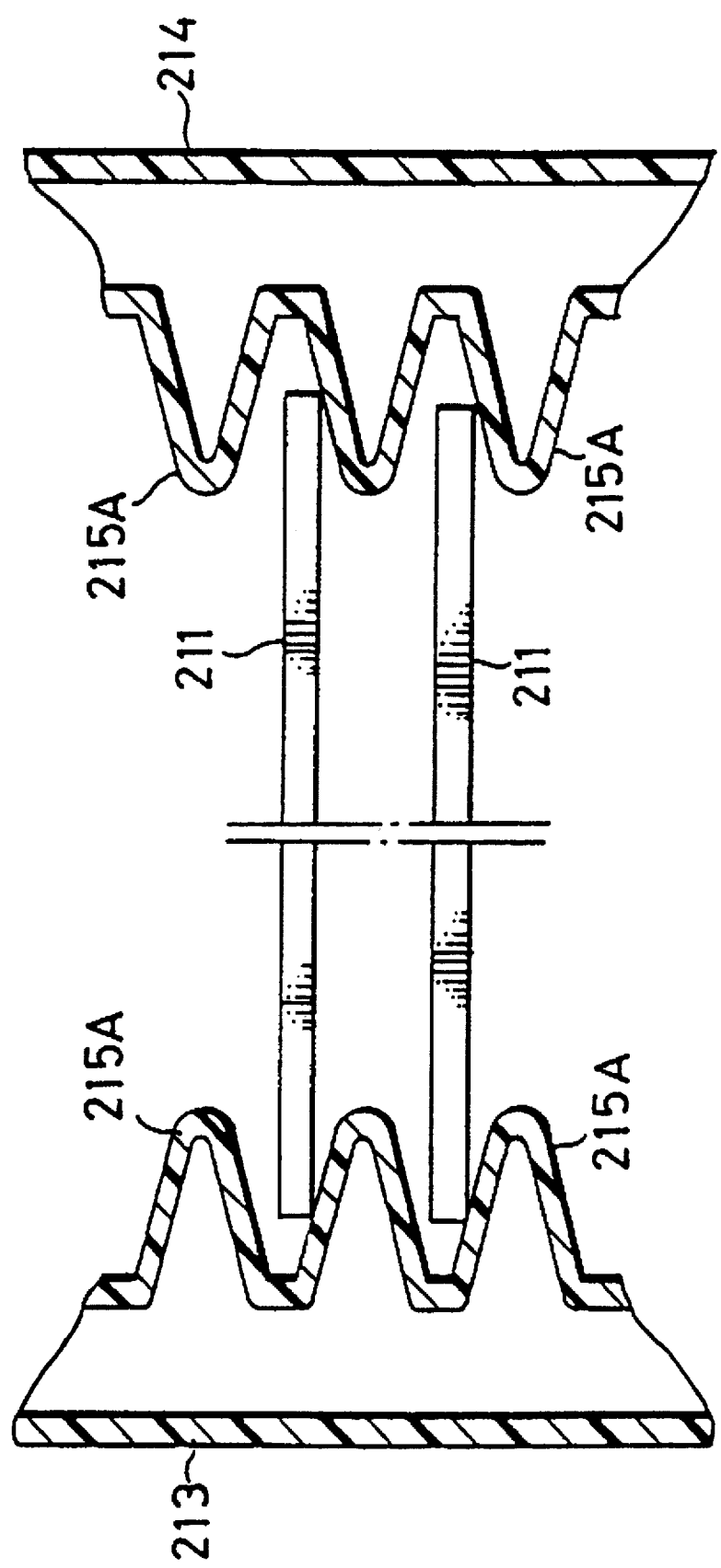
FIG. 4 is a sectional view of ribs in a second embodiment of the present invention, with wafers supported thereon.
Figure 6:
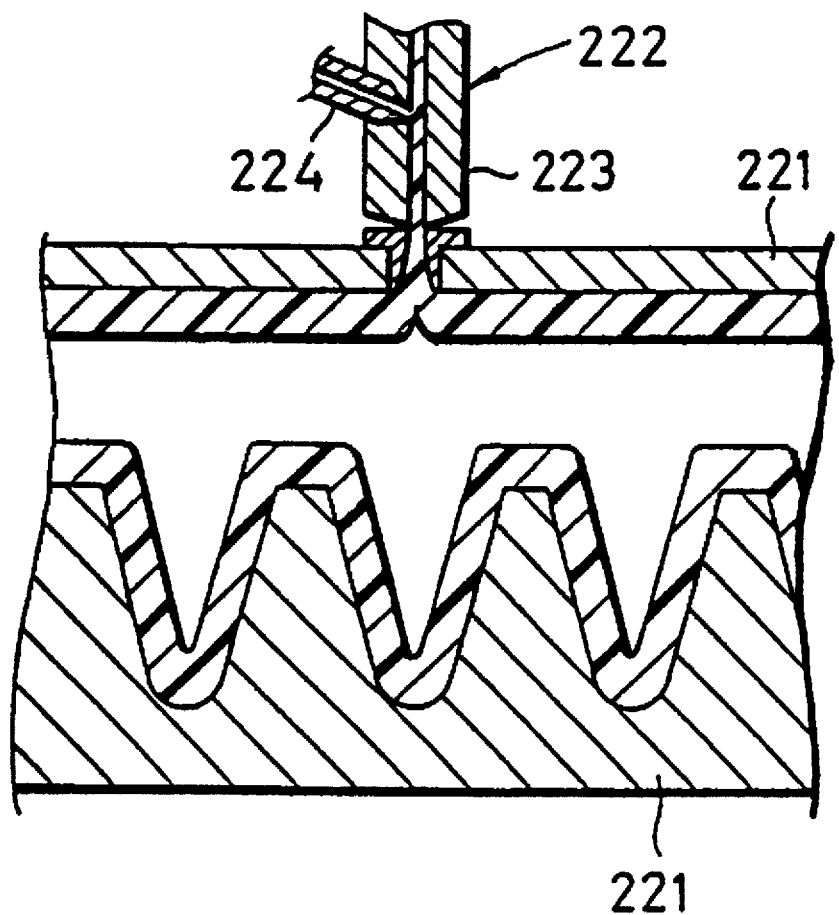
FIG. 6 is a sectional view illustrating molding of a supporting rib portion having a hollow structure.

The supporting rib portion 215 is composed of a multitude of ribs 215A formed in parallel on the inner surface of each of the side walls 213 and 214 at regular intervals. Further, as illustrated in FIG. 4, the entire supporting rib structure 215, which includes the ribs 215A, is hollow, i.e. consists only of a shell. This hollow supporting rib structure 215 is molded as follows. As illustrated in FIG. 6, the molding of the supporting ribs 215 is performed by using, for example, an injection molding machine provided with what is called a gas assistance device of the known type. First, a nozzle 222 is connected to a mold 221. Further, a synthetic resin is injected thereinto from a resin nozzle portion 223 of this nozzle 222. Moreover, gas or gas generating liquid is injected thereinto from a gas nozzle portion 224. Thereby, the synthetic resin is pressed by the gas in the mold 221 against the inner walls thereof. Consequently, the hollow structure consisting only of a shell is formed.

Figure 7:
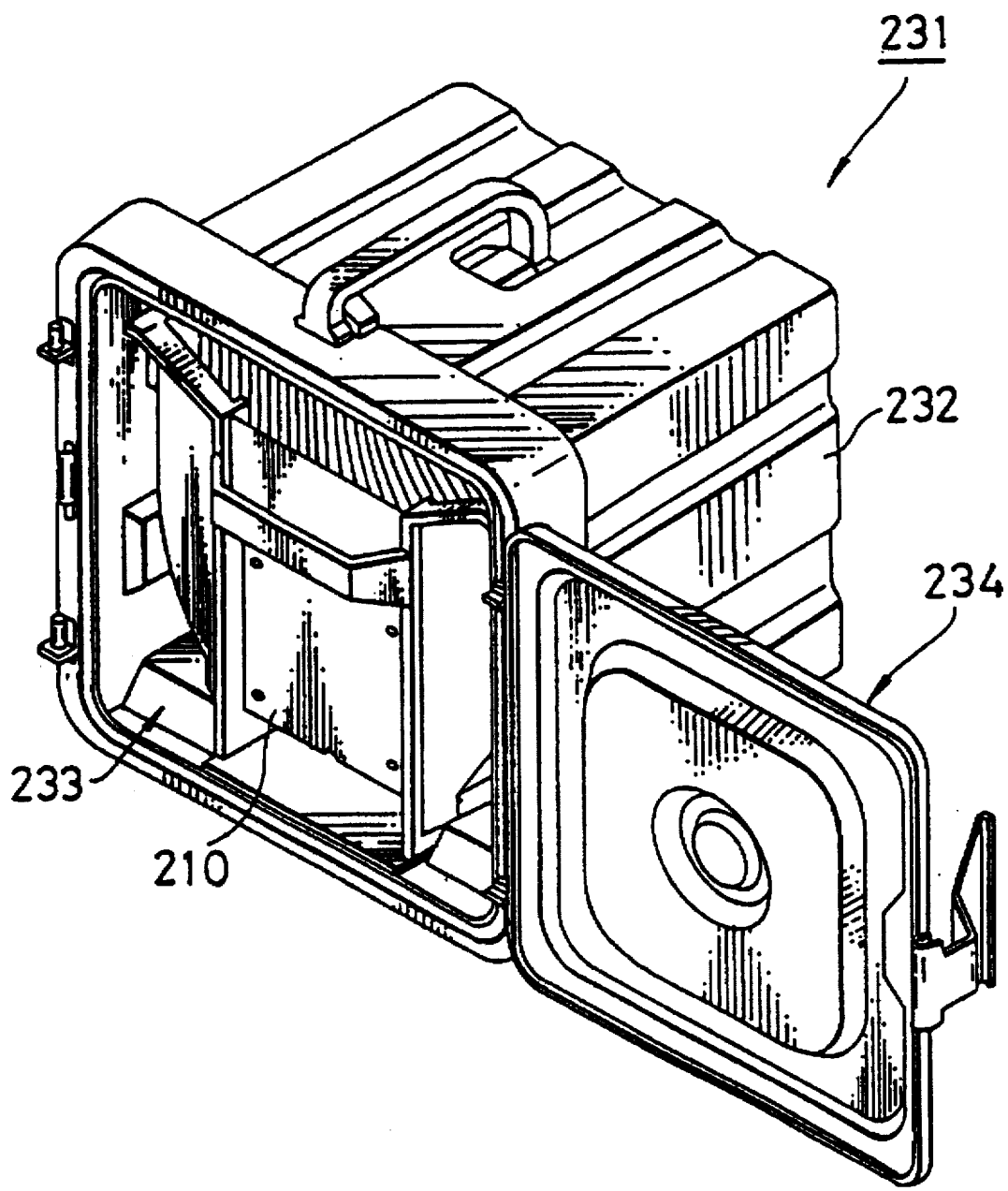
FIG. 7 is a perspective diagram illustrating the second wafer carrier embodying the present invention, namely, the second embodiment of the present invention, within a carrier box.

The wafer carrier 210 having the aforementioned configuration is sometimes enclosed in a carrier box 231, as illustrated in FIG. 7. This carrier box 231 includes a casing 232 with an open end 233 for receiving the wafer carrier 210, and a lid 234 for covering the opening 233 of the casing 232. The wafer carriers 210 are stored and transported in this carrier box 231.

Effects of Second Embodiment

As described above, the supporting ribs 215 of this second embodiment have a hollow structure. Thus, even in the case of a non-planar portion such as the rib piece 215A, the thickness thereof can be made nearly uniform. Thereby, the coefficient of heat contraction upon molding of the rib pieces and so on can be almost constant. Consequently, the accuracy of dimensions of the rib piece or the like can be improved considerably.

Because the ribs 215A are accurately dimensioned, when loading and unloading the wafer 211 by using the robot, the wafer 211 is prevented from coming into contact with the rib piece 215A and with the robot. Thus, the loading and unloading of the wafer 211 is facilitated.

Further, as generally known, a hollow structure results in increase in strength. The high accuracy of dimensioning of the ribs 215A can be maintained owing to the high strength of the ribs 215A.

Moreover, owing to the increase in strength of the rib pieces, mounting support portions 213A and 214A of the side walls 213 and 214 can be prevented from opening. Furthermore, the side walls 213 and 214 can be prevented from warping.

Additionally, the weight of the semiconductor wafer carrier 210 can be reduced.

Examples of Modification of Second Embodiment

While only the side walls 213 and 214 and the supporting rib portion 215 are shown as having a hollow structure, other portions of the wafer carrier may also have a hollow structure. Further, in addition to the semiconductor wafer carrier 210, the carrier box 231 may have a hollow structure.

Third Embodiment

The overall configuration of semiconductor wafer carrier 310 of this embodiment is similar to that of the aforementioned semiconductor wafer carrier 110 of the first embodiment. Practically, as illustrated in FIG. 9, the semiconductor wafer carrier 310 consists of a casing 312, with a top open so as to form a wafer inlet/outlet port 312A, through which a wafer 311 is loaded thereinto and is unloaded therefrom, and supporting rib portions 315 which are respectively formed on the two opposed side walls 313 and 314 of the casing 312 and which serve to hold and support a multitude of wafers 311 in parallel on multiple stages.

The casing 312 consists of the two opposed side walls 313 and 314 and end walls (not shown) for connecting the side walls 313 and 314 with each other at the upper and lower ends (namely, at the front and rear end portions illustrated in this figure). The distance between the side walls 313 and 314 is slightly larger than the maximum diameter of the disk-like wafer 311.

The supporting rib portion 315 is composed of a multitude of ribs 315A formed in parallel on the inner surface of each of the side walls 313 and 314 at regular intervals. Each of the ribs 315A is thin throughout its length so that the distance between the adjacent ribs 315A is increased, thereby facilitating the loading and unloading of the wafer 311. When inserted into a space between adjacent ribs 315A, the wafer 311 is supported at four points, namely, maximum diameter points 325 and 325 (to be described later) and two points on inner supporting portions 322 and 322. Here, note that the maximum diameter points 325 and 325 are points where a line passing through the center of gravity of the wafer 311, fully inserted into the wafer carrier 310, and extending perpendicular to the direction in which the wafer 311 is loaded and unloaded, intersects with the supporting ribs 315.

Figure 8:
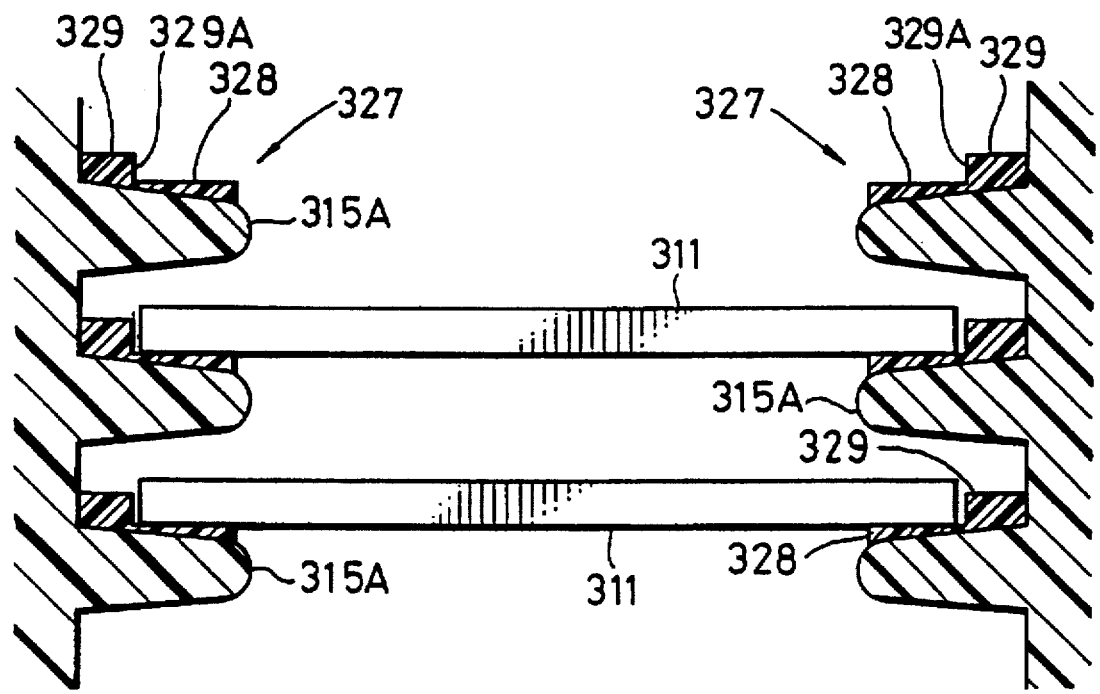
FIG. 8 is a sectional view of supporting rib portion of a third wafer carrier embodying the present invention, namely, a third embodiment of the present invention, with wafers supported thereon.
Figure 9:
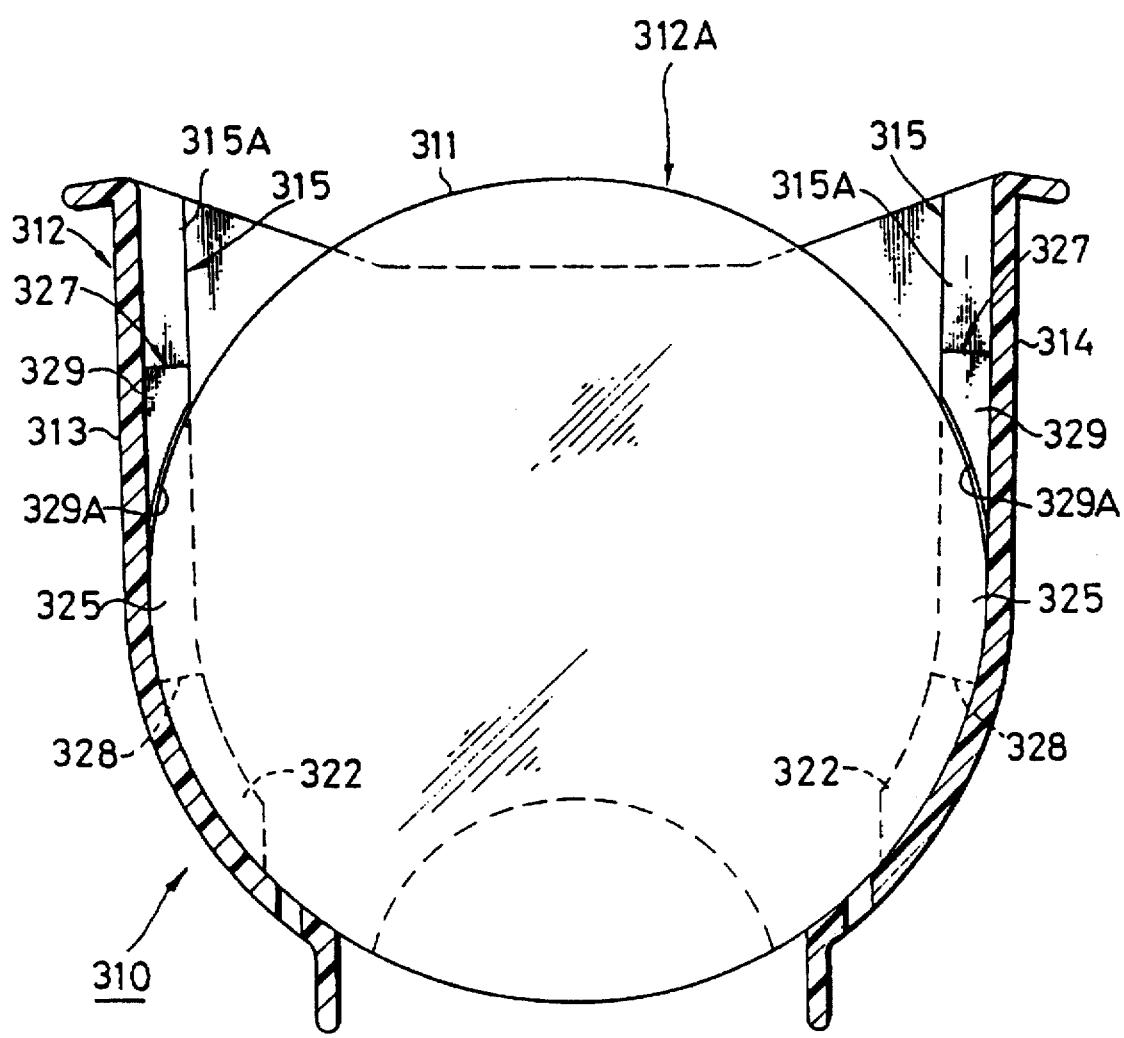
FIG. 9 is a plan sectional view of the third wafer carrier embodying the present invention, namely, the third embodiment of the present invention.

As shown in FIGS. 8 and 9, on the upper side surface of the rib 315A, there is provided a thin-plate supporting portion 327 for supporting the wafer 311 in a horizontal position. The thin-plate supporting portions 327 have a fixed width and are provided on the ribs 315A in front of and in rear of the maximum-diameter-points 325 and 325. The wafer 311 is supported at four points on the two thin-plate supporting portions 327 and the inner portions 322. The size or width of the thin-plate supporting portion 327 may be small (namely, the thin-plate supporting portion may have a narrow width in the longitudinal direction of the rib 315A), because of the fact that the size of the thin plate supporting portion 327 is sufficient as long as the wafer 311 can be supported within the regions adjacent of the maximum-diameter points 325 and 325.

As further shown in FIGS. 8 and 9, each of the thin-plate supporting portions 327 is stepped with a horizontally-supporting-plate part 328 and a shift preventing surface part 329. The horizontally- supporting-plate part 328 provides the maximum-diameter-points 325 and 325 and extends in the longitudinal direction of the rib 315A. The upper side surface of the horizontally-supporting-plate part 328 is accurately horizontal when the wafer carrier 310 is placed with its longitudinal side extending vertically. The wafer 311 inserted into the wafer carrier 310 is supported and maintained in a horizontal position by bringing the lower edge surface thereof to rest on the upper side surface of the horizontally-supporting-plate part 328.

The shift preventing surface portion 329 is arranged outward of the horizontally-supporting-plate portion 328 of the rib 315A. This shift preventing surface portion 329 provides an arcuate wall surface 329A which extends as an arc along the peripheral edge of the wafer 311 placed on the horizontally-supporting-plate part 328. The arcuate wall surface 329A extends to directly confront the front edge portion of the wafer 311 supported by the horizontally-supporting-plate part 328 to thereby prevent a shift in position of the wafer 311. Thus, the wafer 311 is reliably prevented by the shift preventing surface 329 from shifting to the front to the extent of sliding out from the wafer inlet/outlet port 312A.

Operation of Third Embodiment

When the wafer carrier 310 is put into a horizontal position, the wafer 311 is automatically loaded or unloaded by the robot. The ribs 315A are formed in such way that the distance between adjacent ribs is sufficiently great that the wafer 311 does not touch the rib pieces 315A in the loading and unloading.

The wafer 311 loaded by the robot is supported at four points on the thin-plate supporting portions 327 and the inner-part portions 322 and 322.

In each of the thin-plate supporting portions 327, the lower side surface of the edge portion of the wafer 311 rests on the horizontally-supporting-plate part 328 while in abutting engagement with or a small distance from the arcuate wall surface 329A of the shift preventing surface portion 329.

In transport, a shock is often received by the wafer carrier 310. In such a case, the wafer 311 contained in the carrier 310 is liable to slip from the four support points (namely, the thin-plate supporting portions 327 and the inner-part portions 322). That is, the wafer 311 is liable to shift to the front or rear of the wafer carrier (namely, in the direction of the longitudinal direction of the rib 315A) and in the lateral direction. The front portion of this wafer 311, however, abuts the shift preventing arcuate surface portion 329 which surrounds a portion of the peripheral edge of the wafer 311 while the back portion of the wafer 311 is supported by the innermost rib portions 322 which are formed bent inwardly.

Thus, although the wafer 311 may shift to-and-fro slightly, the wafer 311 remains supported at the four points.

Effects of Third Embodiment

The wafer 311 contained in the carrier 310 will hardly shift even when a shock is received from the outside to the carrier 310. Thus, the wafer 311 is securely supported. Consequently, the wafer 311 is reliably prevented from shifting toward the wafer inlet/outlet port 312A and from sliding out therefrom in a worst case scenario. Moreover, the robot can reliably load and unload the wafer without sliding contact therewith.

Examples of Modification of Third Embodiment

Figure 10:
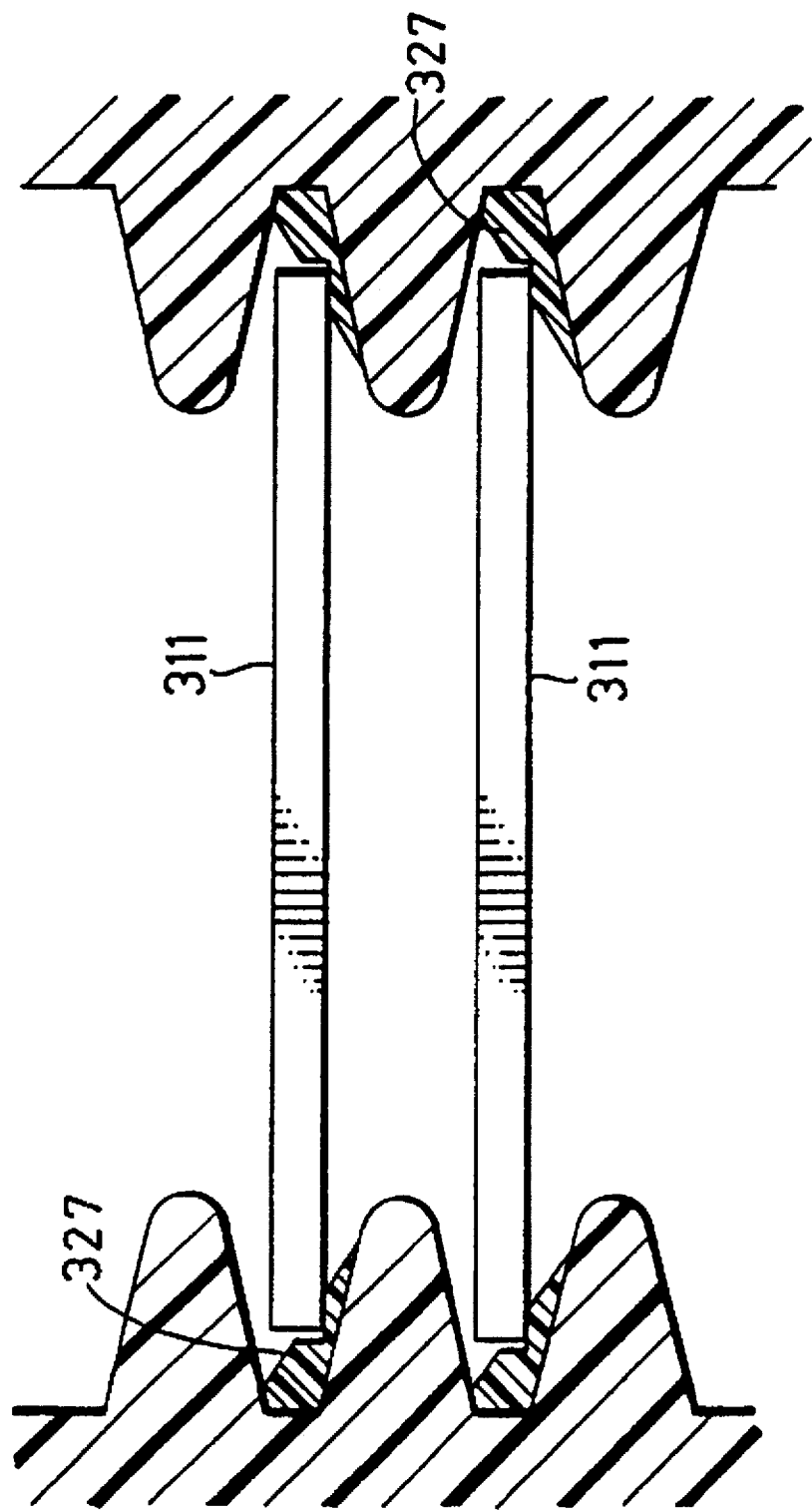
FIG. 10 is a sectional view of a modification of the third wafer carrier embodying the present invention.

In the third embodiment as shown in FIGS. 8 and 9, the thin-plate supporting portions 327 are stepped like a staircase. However, as illustrated in FIG. 10, the thin-plate supporting portions 327 may be sloped, shaped like a wedge, with the horizontally-supporting-plate portion 328 and the shift preventing surface portion 329 both formed on this same sloped surface.

Fourth Embodiment

Figure 11:
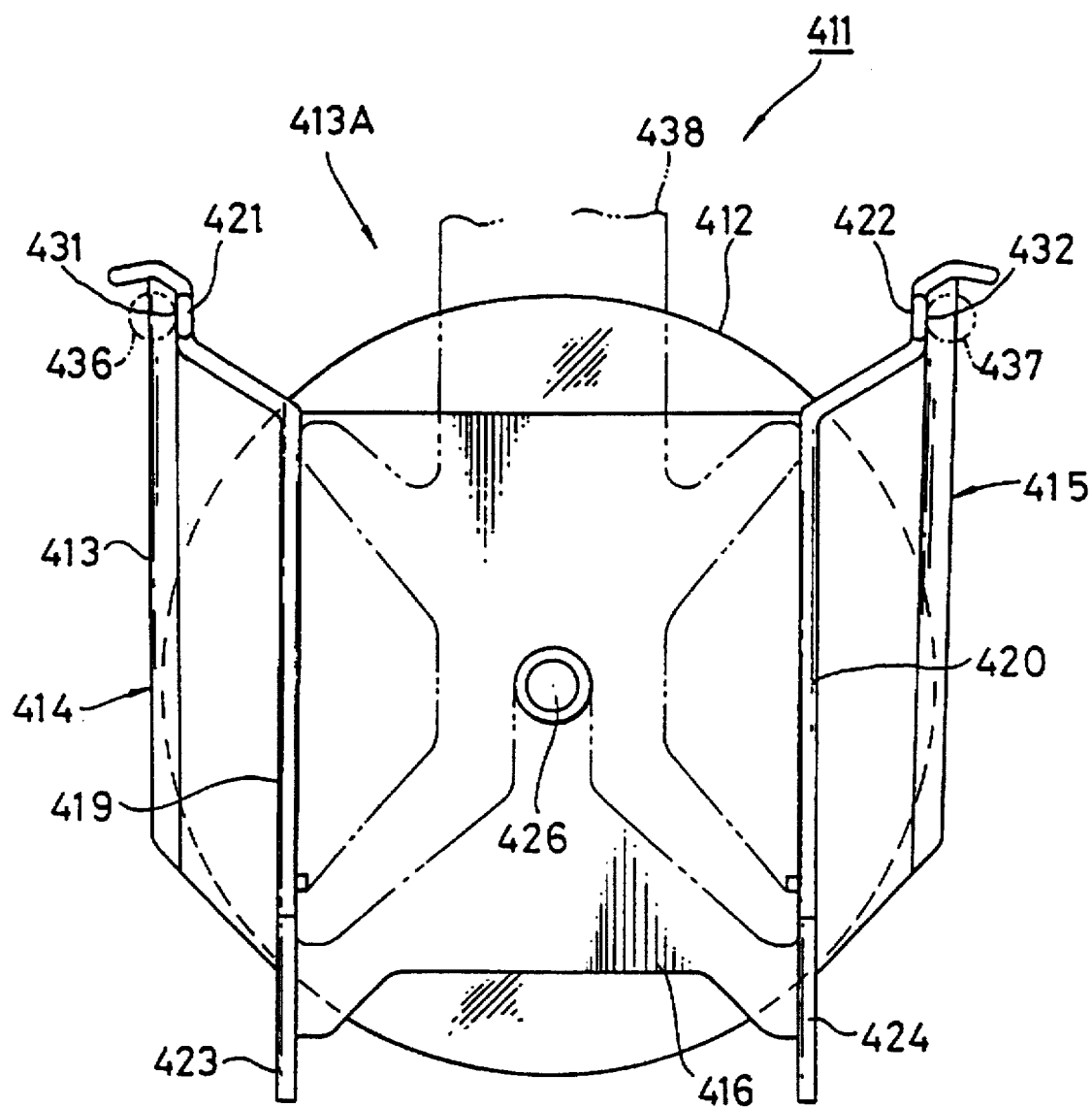
FIG. 11 is a plan view of a fourth wafer carrier embodying the present invention, namely, a fourth embodiment of the present invention.

Semiconductor wafer carrier 411 of this fourth embodiment is designed to contain and support a large-diameter semiconductor wafer 412. The overall configuration of the semiconductor wafer carrier 411 of this embodiment is similar to that of the aforementioned semiconductor wafer carrier 110 of the first embodiment. Practically, as illustrated in FIG. 11, the semiconductor wafer carrier 411 consists of a casing 413, with an open top serving as a wafer inlet/outlet port 413A, through which a wafer 412 is loaded thereinto and is unloaded therefrom, and supporting rib portions (not shown) which are respectively formed on the inner side walls of the casing 413 and serve to hold and support a multitude of wafers 412 in parallel on multiple stages.

This casing 413 consists of side walls 414 and 415, which are provided with the supporting ribs on the inner surfaces thereof and cover the outer peripheral edge surface of the semiconductor wafer 412 contained and supported therein, and front and rear end walls (only the front end wall 416 is shown for sake of simplicity) for connecting the front and rear surfaces of the semiconductor wafer 412.

On the front end wall 416, there are provided casing supports 419 and 420 for supporting the casing 413 accurately in a horizontal position when the casing 413 is placed on a mounting base 418 (see FIG. 12) in such a manner that the longitudinal side thereof extends vertically (namely, in such a manner that the inserted semiconductor wafer 412 is supported in a horizontal position). These casing supports 419 and 420 support the inserted semiconductor wafer 412 accurately in a horizontal position by precisely supporting the casing 413 in a horizontal position. Further, the casing supports 419 and 420 are provided as a pair of left-side and right-side components and are coextensive with the length of the casing, top to bottom as viewed in FIG. 11. Moreover, on the top and bottom end portions of the casing supports 419 and 420, are provided projections 421, 422, 423 and 424 which directly abut the upper surface 418A of the mounting base 418.

Furthermore, a positioning fitting 426 for positioning the casing 413 is provided on the front end wall 416. This positioning fitting 426 is located at a position which corresponds to the center of the semiconductor wafer 412 contained in the casing 413. This location of the fitting 426 serves to indirectly position the contained semiconductor wafer 412.

As illustrated in FIG. 15, the fitting 426 is formed as a short cylinder or socket. The innermost part of the fitting 426 (namely, the top end portion thereof as viewed in this figure) is closed to prevent dust and the like produced by the friction between the positioning fitting 426 and a positioning pin 435 from entering into the casing 413. The inner peripheral edge of the cylindrical wall surrounding the bottom end opening of the positioning fitting 426 is tapered so that the positioning pin 435 (to be described later) can be smoothly inserted. The depth of the positioning fitting 426 is set so that when the casing 413 is placed on the upper surface 418A of the mounting base 418 and the positioning fitting 426 is fit onto the positioning pin 435, the tip portion (namely, the top end portion) of the positioning pin 435 does not touch the innermost end (top) of the positioning fitting 426. If the tip of the positioning pin 435 touches the top of the positioning fitting 426, the, casing 413 is elevated by he positioning pin 435, and the front end wall 416 becomes displaced and error is introduced into the vertical positioning of the wafer 412.

The sides of the casing supports 419 and 420 corresponding to the horizontally-supporting projections 421 and 422 are formed in such a way that accurate dimensions are obtained. These side portions 431 and 432 serve to prevent rotation of the casing about pin 435 by abutting engagement with the rotation preventing pins 436 and 437 of the mounting base 418, respectively. Thus, the side portions 431 and 432, by preventing the casing 413 from rotating around the positioning pin 435, serve to accurately orient the port 413A in the direction of a hand 438 of the robot.

Figure 12:
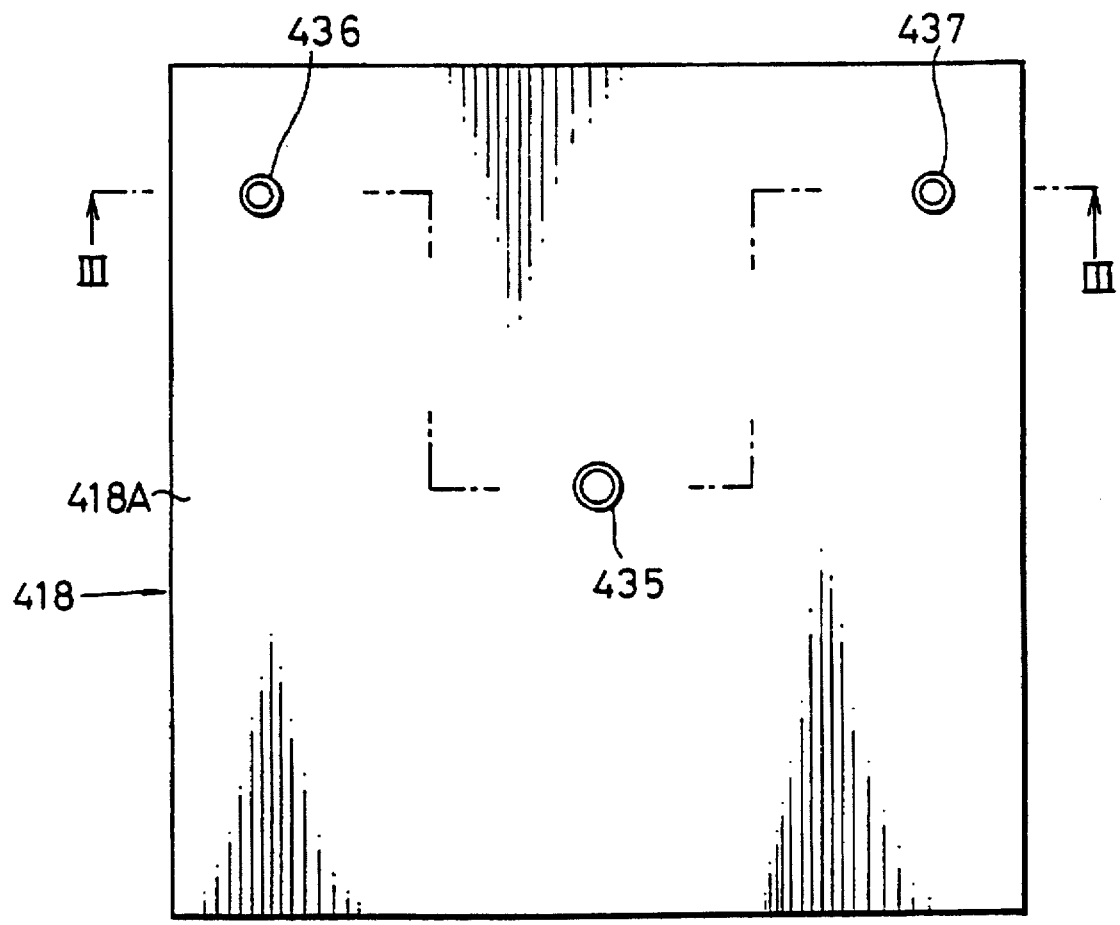
FIG. 12 is a plan view of a mounting base for holding the fourth wafer carrier embodying the present invention, namely, the fourth embodiment of the present invention.
Figure 13:
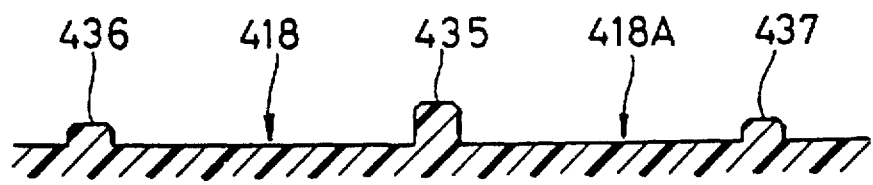
FIG. 13 is a sectional view taken on line III—III in FIG. 12.
Figure 16:
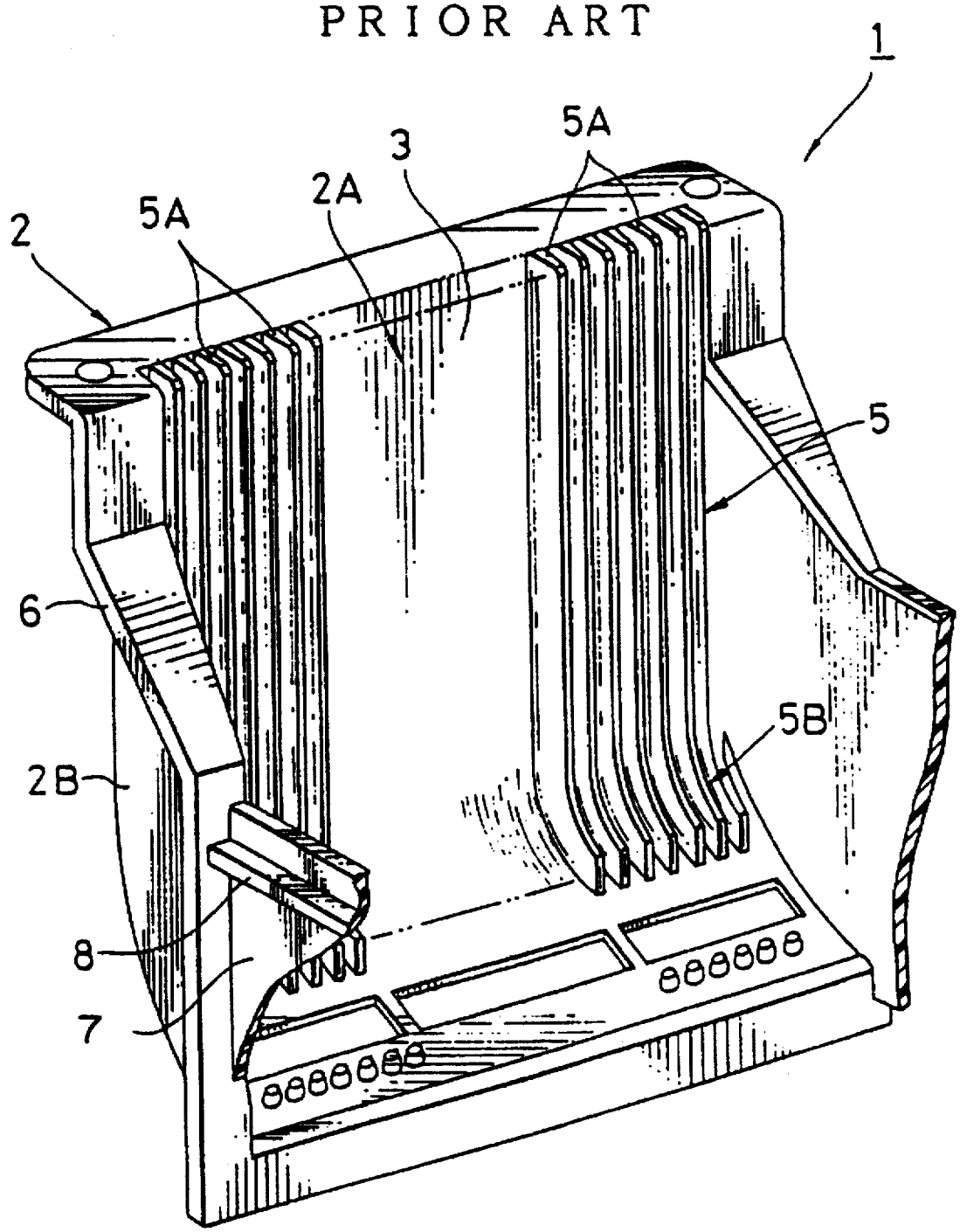
FIG. 16 is a partially cutaway view of a conventional wafer carrier.
Figure 17:
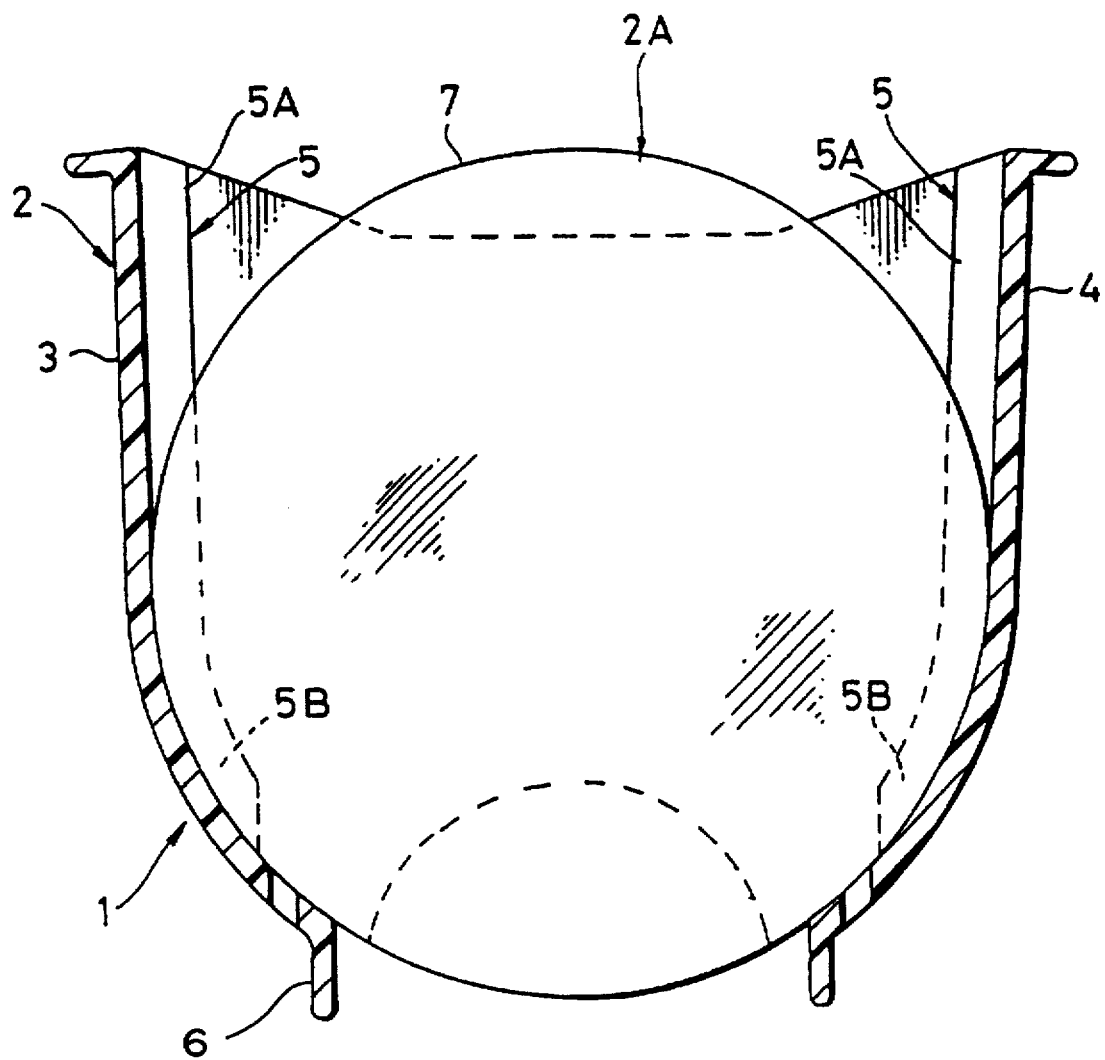
FIG. 17 is a plan sectional view of the conventional wafer carrier of FIG. 16.
Figure 18:
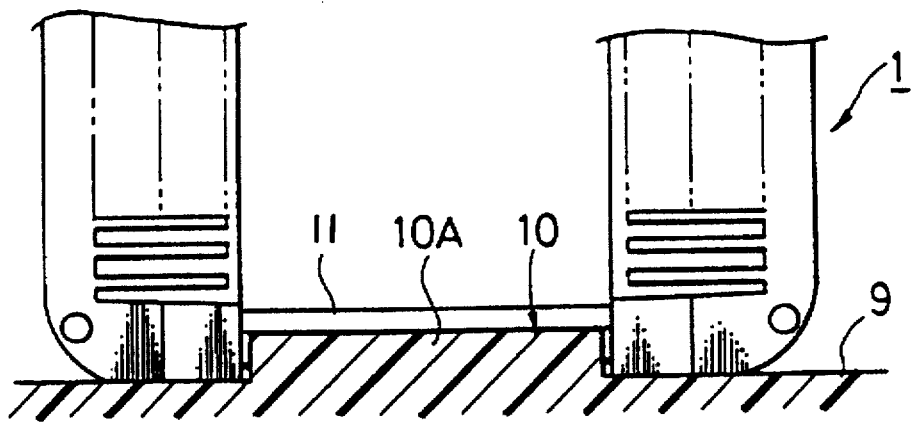
FIG. 18 is a side view of the conventional wafer carrier of FIG. 16 positioned on a mounting base.
Figure 19:
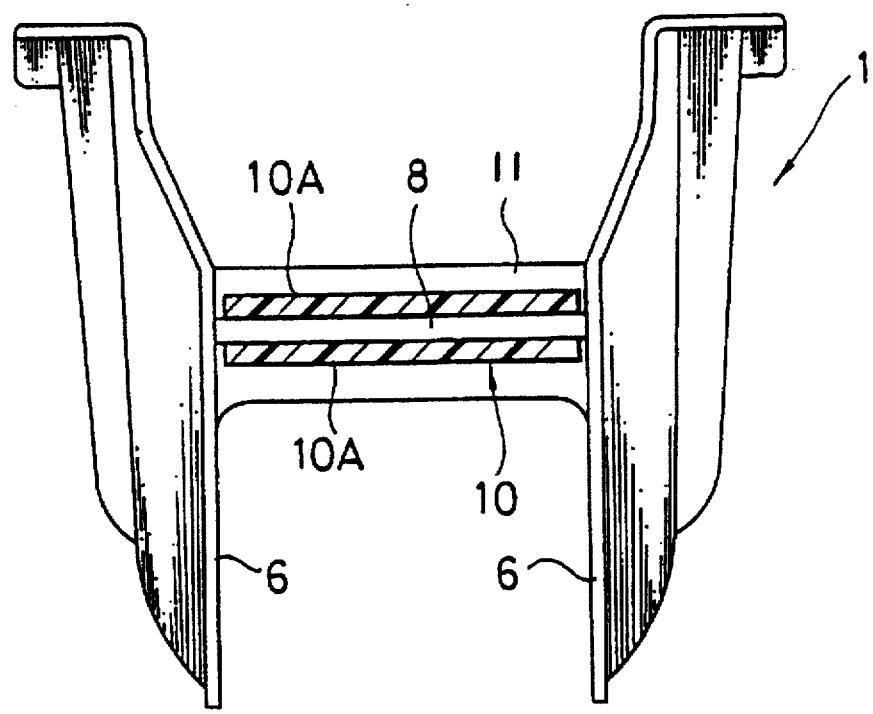
FIG. 19 is a plan view of the mounting elements of the conventional wafer carrier shown in FIG. 18.

As illustrated in FIGS. 12 and 13, the mounting base 418 has the upper surface 418A which is a horizontally flat surface and is finished with high accuracy. The positioning pin 435, serving as the fitting which mates with the positioning fitting 426 of the front end wall 416, is located in the central portion of this upper surface 418A. The top peripheral edge of the positioning pin 435 is tapered so that the positioning pin 435 can be smoothly inserted into the positioning fitting 426. Further, the rotation preventing pins 436 and 437 are located to abut the rotation prevention side portions 431 and 432 of the casing 413, respectively, when the positioning fitting 426 is fit on the positioning pin 435.

Operation of Fourth Embodiment

The wafer carrier 411 having the aforementioned configuration is positioned on the mounting base 418 and the semiconductor wafer 412 is automatically loaded and unloaded in the following manner.

A plurality of semiconductor wafers 412 are inserted and supported on multiple stages in parallel in the wafer carrier 411. This wafer carrier 411 is placed on the mounting base 418. Practically, when the horizontally supporting projections 421, 422, 423 and 424 of the casing supports 419 and 420 are directly resting on the upper surface 418A of the mounting base 418, the wafer carrier 411 is properly positioned on the mounting base 418. Further, at that time, the positioning fitting 426 of the front end wall 416 is mated with positioning pin 435. Moreover, the rotation prevention fitting portions 431 and 432 are fit between the rotation preventing pins 436 and 437. The horizontal positioning (namely, the lateral positioning) of the casing 413 is also achieved by mounting the positioning fitting 426 on the positioning pin 435. Furthermore, the positioning of the opening port 413A is determined by engagement of the rotation prevention side portions 431 and 432 with the rotation preventing pins 436 and 437, respectively.

The supporting ribs of the casing 413 and the semiconductor wafers 412 supported thereon are accurately positioned with respect to the hand 438 of the robot. When the casing 413 is in this state, the robot inserts the hand 438 into a space between the adjacent semiconductor wafers 412 and lifts the semiconductor wafer slightly. Then, this wafer 412 is unloaded therefrom. Further, the semiconductor wafer 412 supported by the hand 438 is accurately inserted into a space between adjacent supporting ribs and then the hand 438 is lowered slightly. Thereafter, this semiconductor wafer 412 may be pulled out of the casing 413 without touching another semiconductor wafer 412. At that time, because the carrier opening is properly oriented by means of the rotation prevention side portions 431 and 432 engaging the rotation preventing pins 436 and 437, the hand 438 of the robot can smoothly enter into and withdraw from the casing 413 without touching the side walls 414 and 415 of the casing 413.

Effects of Fourth Embodiment

As stated above, in the case of the semiconductor wafer carrier 411 of this embodiment, if the size of the wafer carrier 411 is increased to accommodate an increase in diameter of the semiconductor wafer 412, the horizontal positioning of the semiconductor wafer 412 can be achieved easily and accurately by utilizing the positioning fitting 426. The horizontal positioning of the semiconductor wafer 412, centered on the positioning fitting 426, is thereby accurate. At that time, if there is a gap between the top of the positioning fitting 426 and the upper end of the positioning pin 435 vertical positioning of the wafer 412 is also accurate. Consequently, the vertical positioning of the wafer 412 is accurately achieved by utilizing only the horizontally supporting projections 421, 422, 423 and 424.

Moreover, the angular positioning of the wafer 412 can be performed easily and accurately by utilizing the rotation prevention side portions 431 and 432. Thus, the opening port 413A of the casing 413 can be accurately directed to the hand 438 of the robot and, as a consequence, the hand 438 of the robot can be reliably prevented from touching the semiconductor wafer 412 and the casing 413. Damage to the surface of the semiconductor wafer 412 and the generation of dust is thereby prevented.

Examples of Modification of Fourth Embodiment

In the fourth embodiment as described above, the positioning fitting 426 is provided on the front end wall 416. The positioning fitting 426, however, may be provided on the rear end wall (not shown) or on either of the front and rear end walls.

Moreover, in the aforementioned fourth embodiment, the fitting for positioning is socket 426; however, it may be a projection similar to the positioning pin 435.

Furthermore, in the aforesaid fourth embodiment, the rotation prevention elements 431 and 432 are the outer surface side portions of the casing supports 421 and 422. However, rotation prevention elements 431 and 432 may each be a socket, a projection, an elongated groove or a ridge. Thus, the rotation of the casing can be prevented by providing only one set of such elements thereon. Needless to say, two or more sets of such elements may be provided on the casing.

When one of the rotation prevention elements is a socket, a projection is provided on the upper surface 418A of the mounting base 418. Similarly, when one of the rotation prevention elements is a projection, a socket is provided in the upper surface 418A of the mounting base 418. Further, when one of the rotation prevention elements is an elongated groove, the elongated groove is formed in, for example, each of the casing supports 419 and 420. In this latter case, a ridge which mates with the elongated groove is formed on the upper surface 418A of the mounting base 418. Similarly, when one of the rotation prevention elements is a ridge, the ridge is formed on, for example, each of the casing supports 419 and 420. Furthermore, an elongated groove which fits onto the ridge is provided on the upper surface 418A of the mounting base 418.

Additionally, in the aforementioned fourth embodiment, the rotation prevention elements 431 and 432 are provided on the outer sides of the projections 421 and 422, respectively. It is preferable that the rotation prevention elements 431 and 432 be located as far as possible from the positioning fitting 426 in the front-end-wall-side of the casing 413. This is because, as the location of the rotation prevention element is located farther from the positioning fitting 426, a change in angular orientation is amplified and any error in angular positioning can be limited to a small value.

As above described in detail, in the case of the thin-plate supporting container of the present invention, a thin plate can be supported accurately in a horizontal position and can be prevented from touching another thin plate, the container, the fork of the robot and so forth when loaded or unloaded.

Further, at least the supporting rib has a hollow structure. Thus, even in the case of a non-planar portion, the thickness thereof can be almost uniform. Thereby, the influence of heat contraction upon molding of the rib pieces and so on can be eliminated. Consequently, the dimensional accuracy of each portion of the container can be improved considerably.

Moreover, each rib piece may be provided with a thin plate supporting portion consisting of the horizontally-supporting-plate part and the shift preventing surface part. In such embodiments, even when a shock is received by the container from the outside, a thin plate enclosed in the container can be prevented from becoming out of place.

Furthermore, if the size of the thin-plate supporting container increases as the diameter of the thin plate is upsized, the horizontal positioning of the thin plate can be achieved easily and accurately by utilizing the fitting for positioning. Thereby, the horizontal positioning of the thin-plate supporting container and the thin plate contained therein can be accurate.

Additionally, the proper angular positioning can be achieved easily and accurately by utilizing the rotation prevention fitting. Thus, when a thin plate is loaded or unloaded through the opening or port, the thin plate and the hand of the robot do not touch the thin-plate supporting container.

Although the preferred embodiments of the present invention have been described above, it should be understood that the present invention is not limited thereto and that other modifications will be apparent to those skilled in the art without departing from the spirit of the invention. The scope of the present invention, therefore, is to be determined solely by the appended claims.

What is claimed is:

1. A thin-plate supporting container comprising:

a casing having first and second opposed side walls, an open end serving as an inlet/outlet port, through which thin plates are load and unloaded from the container, and a rear end; and first and second pluralities of spaced parallel ribs extending along interior surfaces of said first and second opposed side walls, respectively, the ribs of said first plurality being aligned with corresponding ribs of said second plurality, along a line perpendicular to said opposed side walls, to define plural stages for holding the thin plates, each of said ribs including a plate support portion and a raised portion which together define an upper surface for each rib with a step separating said plate support portion from said raised portion and forming a shoulder for abutting the edge of a thin-plate for holding the thin-plate resting on said plate support portion in a fixed position within the container.

2. A container according to claim 1 wherein said shoulder is curved in an arc to mate with a circular thin plate.

3. A container according to claim 1 wherein each rib has said raised portion located between said open end and said plate support portion, with said shoulder transverse the width of the rib to prevent the thin-plate from shifting toward said open end.

* * * * *

UNITED STATES PATENT AND TRADEMARK OFFICE
CERTIFICATE OF CORRECTION

PATENT NO. : 5,706,946
DATED : January 13, 1998
INVENTOR(S) : KAKIZAKI et al

It is certified that error appears in the above-indentified patent and that said Letters Patent is hereby corrected as shown below:

Col. 13, line 17, "he" should read --the--.

Col. 16, line 20, delete "load" insert --loaded--; and
line 40, after "transverse" insert --to--.

Signed and Sealed this

Third Day of November, 1998

Attest:

BRUCE LEHMAN

Attesting Officer

Commissioner of Patents and Trademarks